United States Patent [19]

Higuchi

[11] Patent Number: 4,847,991

[45] Date of Patent: Jul. 18, 1989

[54] METHOD FOR INSERTING CHIP PARTS INTO A HOLDING PLATE AND APPARATUS USED FOR THE SAME

[75] Inventor: Hirokazu Higuchi, Komatsu, Japan

[73] Assignee: Murata Manufacturing Co., Ltd., Kyoto, Japan

[21] Appl. No.: 152,798

[22] Filed: Feb. 5, 1988

[51] Int. Cl.$^4$ ............................................. H05K 3/30
[52] U.S. Cl. ...................................... 29/759; 29/740; 29/760; 29/559
[58] Field of Search ................ 29/235, 740, 741, 739, 29/759, 760, 559, 450; 118/500, 503

[56] References Cited

U.S. PATENT DOCUMENTS

| | | | |
|---|---|---|---|
| 4,102,043 | 7/1978 | Andrade et al. | 29/739 |
| 4,381,321 | 4/1983 | Braden. | |
| 4,393,808 | 7/1983 | Braden. | |
| 4,395,184 | 7/1983 | Braden. | |
| 4,526,129 | 7/1985 | Braden. | |
| 4,584,764 | 4/1986 | Gussman | 29/762 |
| 4,664,943 | 5/1987 | Nitta et al. | |

Primary Examiner—Carl E. Hall
Attorney, Agent, or Firm—Wenderoth, Lind & Ponack

[57] ABSTRACT

An insertion apparatus for inserting chip parts into through holes in a holding plate having a plurality of such through holes therein surrounded by elastic material for resiliently holding the chip parts in the respective through holes. The insertion apparatus has a generally plate-shaped member having a plurality of individual through bores therein each separate from the other through bores and at positions corresponding to the positions of the through holes in the holding plate, each of the through bores having a larger portion with an outer end communicating with one surface of the member and having a cross-sectional size sufficiently large to hold one of the chip parts, and a smaller bore portion extending from the inner end of the larger bore portion to the other surface of the member and having a cross-sectional size smaller than the cross-sectional size of the chips parts.

3 Claims, 2 Drawing Sheets

METHOD FOR INSERTING CHIP PARTS INTO A HOLDING PLATE AND APPARATUS USED FOR THE SAME

FIELD OF THE INVENTION

The present invention relates to an apparatus used in a method for inserting chip parts into a holding plate used in a process of applying terminal electrodes to the chip parts like a chip capacitor, a chip resistor or the like.

In order to carry out the process of applying terminal electrodes to the chip parts or measuring the chip characteristic, as disclosed in the U.S. Pat. Nos. 4,381,321, 4,393,808, 4,395,184, and 4,664,943, a holding plate and an insertion apparatus for inserting the chip parts therein are used.

FIG. 2 shows the conventional holding plate, FIG. 6 shows the conventional process of inserting the chip parts into the holding plate, and FIG. 7 shows a process of applying electrodes to the chip parts respectively.

In the above drawings, a holding plate 11 comprises a combination of a plate body 12 of a hard material such as metal, synthetic resins, or the like with an elastic member 13 of elastic material, such as silicon rubber or the like, the plate body 12 being integral with a plate 16 provided inside a frame 14 with a plurality of through bores 15 disposed in parallel to each other. Although a convenient number of through bores are shown, one holding plate 11 actually is provided with 2000 to 5000 through bores.

At the opposite sides of the frame 14 at the plate body 12 are provided grooves 111, which engage slidably with rails in an automatic machine to move the plate body 12 thereon.

The elastic member 13 is provided on both surfaces of the plate 16 at the plate body 12 and extends through the through bores 15, and at the elastic member 13 in the vicinity of each through bore 15 is formed a through bore 17 slightly smaller in the size than each chip part, as discussed below.

In the aforesaid holding plate 11, for example as shown in FIG. 7, the chip part 21 is inserted into each through bore 17 for exposing one end of the chip part 21, thereby being held in the holding plate 11 by the elastic force of the elastic member 13.

When each chip part 21 is inserted into each through bore 17, as shown in FIG. 6, an insertion apparatus 19 is used which has through bores 18 slightly larger in size than the chip part 21 and positioned corresponding to the through bores 17 at the holding plate 11 respectively. In other words, the insertion apparatus 19 is overlapped integrally with the holding plate 11 and the through bores in both the members 19 and 11 are set in alignment with each other. Then, a large number of chip parts 21 are placed on the insertion apparatus 19 and sucked from below the through bores 17 at the holding plate 11, the holding plate 11 and insertion apparatus 19 being swung to thereby put the chip parts 21 into the through bore 18 at the insertion apparatus 19 respectively.

Then, pins 20 pusch the chip parts 21 into the through bores 17 in the holding plate 11 for exposing the upper ends of chip parts 21 upwardly from the upper surface of the holding plate 11 respectively.

Next, the holding plate 11 carrying the chip parts 21 exposed upwardly therefrom is turned upside down to direct the exposed ends of chip parts 21 downwardly and push them onto electrode material 23 which may be a paste of silver or the like attached to a coating plate 22.

However, the insertion method for inserting the chip parts into the holding plate as above-mentioned has the following defects:

(1) When the chip parts 21 are put into the through bores 18 in the insertion apparatus 19 respectively, since the insertion apparatus 19 is overlapped with the holding plate 11 and both the members are set (unless they are set, the chip parts 21 may drop), dust or debris from the chip parts may drop onto the holding plate 11, resulting in the holding plate being stained.

Moreover, the dust or the like attached to the holding plate 11, when it is turned upside down to apply electrodes to the chip parts 21, may fall into the electrode material 23 to cause it to be stained.

(2) The holding plate 11 and insertion apparatus 19 must be set integral and the through bores 17 must be aligned with bores 18 respectively, thereby complicating the insertion work.

(3) In order to apply electrodes to the chip parts 21 after they are inserted into the through bores 17 in the holding plate 11, it is required to turn the holding plate 11 upside down which is an added step in the process. The reason for the above is that each chip part 21 is inserted into the through bore 17 with one end exposed from the upper surface of the holding plate 11 and then the holding plate 11 is turned upside down to apply an electrode to the chip part, thereby restraining the chip part 21 from passing through the through bore 17 and avoiding an injury to the inner surface thereof as much as possible. Moreover, the extra step as above-mentioned will create a particularly large problem when the process is automatized.

OBJECTS OF THE INVENTION

A first object of the present invention is to provide an apparatus for use in an insertion method for inserting chip parts into a holding plate, which prevents the holding plate from being stained when the chip parts are inserted therein.

A second object of the present invention is to provide an apparatus for use in an insertion method for inserting chip parts into a holding plate, which prevents electrode material from being stained when the chip parts are applied with the electrodes.

A third object of the present invention is to provide an apparatus for use in an insertion method by which it is easy to insert the chip parts into the holding plate, A fourth object of the present invention is to provide an apparatus for use in an insertion method for inserting the chip parts into the holding plate, which can apply the electrodes to the chip parts without turning the holding plate in which the chip parts are inserted upside down, thus saving a number of steps and facilitating automatization.

A fifth object of the present invention is to provide an insertion apparatus which is simple in construction for inserting the chip parts into the holding plate.

These and other objects and characteristics of the present invention will become more apparent upon a reading of the following detailed description with reference to the accompanying drawings.

DETAILED DESCRIPTION OF THE INVENTION

Figure 1:
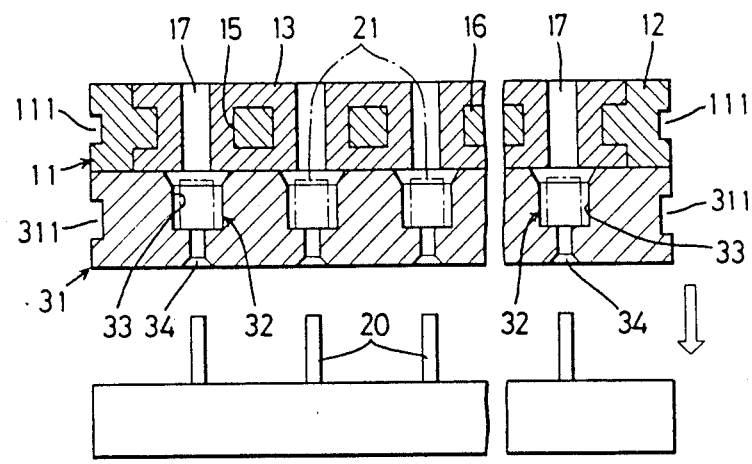
FIG. 1 is a sectional view explanatory of an embodiment of an insertion apparatus of the invention for inserting chip parts into a holding plate.
Figure 2:
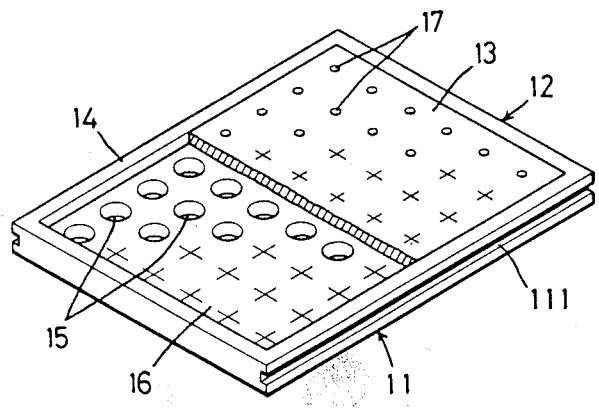
FIG. 2 is a partially cutaway perspective view of an embodiment of the conventional holding plate shown in FIG. 1, FIGS. 3 through 5 are sectional views of modified embodiments of the holding plate in FIG. 1.
Figure 6:
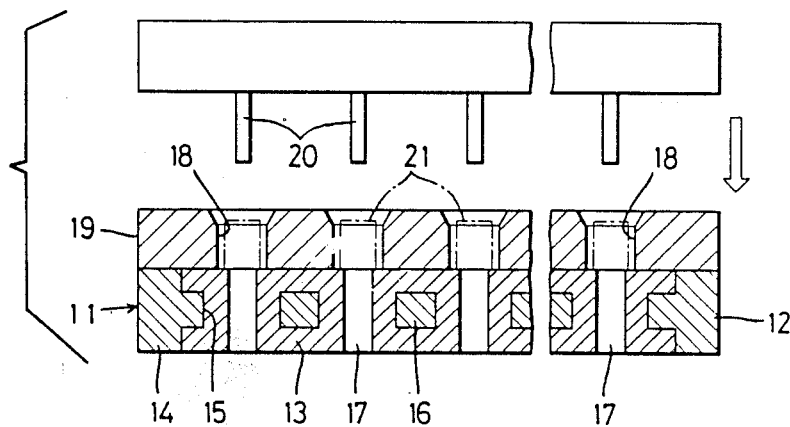
FIG. 6 is a sectional view explanatory of the conventional insertion method and apparatus for inserting chip parts into a holding plate.
Figure 7:
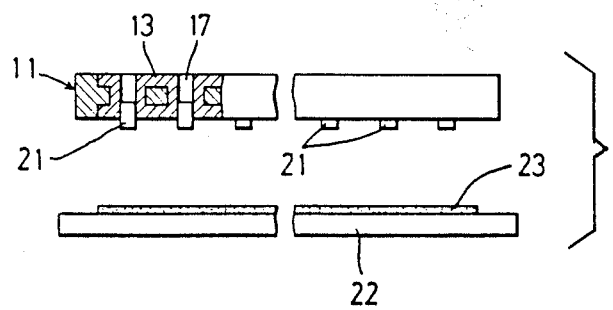
FIG. 7 is a sectional view showing the state where the chip parts held into the holding plate have applied with electrodes applied respectively.

FIG. 1 is a sectional view to show an insertion apparatus of the invention. In addition, in FIG. 1, the components the same as those in FIGS. 2, 6 and 7 are designated by the same reference numerals and an explanation is omitted.

In this embodiment, an insertion apparatus 31 is provided at the positions corresponding to through bores 17 at a holding plate 11 with a plurality of through bores 32 respectively. The through bores 32 each comprise a large bore portion 33 open at one surface of the insertion apparatus 31 and of a size sufficient to loosely contain one chip part 21 and a smaller bore portion 34 which is open at the other surface of insertion apparatus 31 and of the size smaller than the chip part 21 but enough to allow each pin 20 to pass through the smaller bore portion 34, the larger and smaller bore portions 33 and 34 communicating with each other.

In addition, it is preferable that the entrance of each larger bore portion 33 is tapered so as to be enlarged as shown. Thus, the chip parts 21 are guided easily and reliably into the larger bore portions 33 respectively.

Also, it is preferable that the outer end of each smaller bore portion 34 is tapered to facilitate the insertion of each pin 20.

The insertion apparatus 31 is formed a hard material of, for example, metal or resin, and has grooves 311 at opposite side surfaces of the apparatus 31, the grooves 311 engaging slidably with, for example, rails in an automatic machine and used to move thereon the insertion apparatus 31.

The through bores 32 in the insertion apparatus 31 may be formed by various methods as follows:

For example, drills of larger diameter and smaller diameter can be used to drill the flat-plate-like insertion apparatus 31 at both the surfaces thereof, whereby the larger bore portions 33 and smaller bore portions 34 can be formed, and each larger bore portion 33 can be tapered by the drill.

For an insertion apparatus 31 having a thickness, the through bores 32 may be formed by etching.

Also, a plate having larger bore portions 33 may be superposed on one having the smaller bore portions 34 to form the insertion apparatus 31.

The through bore portions 32 (more concretely, the larger bores 33) in the insertion apparatus 31 and through bores 17 in the holding plate 11 can have various cross-sectional shapes corresponding to the cross-sectional shape of each chip part 21.

For example, when each chip part 21 is square or rectangular in cross-section, the larger bore portions 33 of each through bore 32 and each through bore 17 may be round in cross-section, or square or rectangular in cross-section corresponding to the cross-sectional shape of each chip part.

When the insertion apparatus 31 constructed as above-described is used to insert the chip parts into the holding plate 11, the insertion apparatus 31 at first has at the surface where the larger bore portions 33 open faced upwardly and then a larger number of chip parts 21 than the number of holes are put on the surface. The insertion apparatus 31 is swung (or vibrated) by, for example, a vibrator, and suction exerted from the small bore portion 34 side, if needed, thereby drawing the chip parts 21 into the large bore portions 33 of the through bores 32 respectively.

Next, the holding plate 11 is placed on top of the insertion apparatus 31 and fixed thereto with the through bores 17 and 32 aligned with each other.

Then, the pins 20 are inserted into the small bore portions 34 in the insertion apparatus 31 and moved upwardly to insert the chip parts 21 into the through bores 17 in the holding plate 11 so that each chip part 21 is pushed upwardly to the predetermined position where it is exposed at the lower end thereof downwardly of the lower end of each through bore 17 in the holding plate 11.

Thus, each chip part 21 is elastically held in the through bore 17 with the lower end exposed downwardly from the through bore 17.

In this case, the pins 20 may be fixed and the insertion apparatus 31 and holding plate 11 may be pushed downwardly. In brief, the chip parts 21 need only be pushed up relative to the holding plate 11.

When electrodes are applied in the chip parts 21 held in the holding plate 11 as above-described, such that the chip parts 21 are exposed downwardly from the through bores 17 in the holding plate 11 respectively, the holding plate 11 need not be turned upside down as is as conventional. In other words, one end of each chip part 21 directed downwardly can be applied as it is with the electrodes respectively as shown in FIG. 7. When the other end of each chip part is to have electrode material applied thereto, each chip part may project from the opposite end of the through bore 17, or the chip parts may be transferred to a separate holding plate and then have the electrode material applied thereto.

In a case where the chip parts 21 are housed in the through bores 32 at the insertion apparatus 31 by the aforesaid insertion method, there is no need for the insertion apparatus 31 and holding plate 11 to be set together as is conventional. Even so, there is no fear that the chip parts 21 escape from the through bores 32 respectively. Hence, conventional complexity for setting both the insertion apparatus 31 and holding plate 11 is eliminated.

Also, since the holding plate 11 is placed over the insertion apparatus 31 and the chip parts 21 are pushed upwardly to be inserted into the holding plate 11, there is no fear that the holding plate 11 will stained by dust or the like. Moreover, the process which turns the holding plate 11 upside down so that the chip parts 21 can have the electrode material applied thereto can be omitted.

In addition, the holding plate 11 for the chip parts 21 may be constructed be in various ways when they use the elastic member 13 having the through bores for elastically holding therein the chip parts, whereby the invention is not united to the aforesaid holding plate 11.

Figure 3:
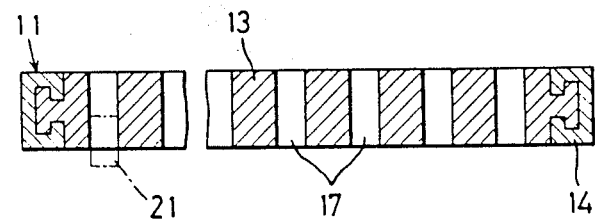
Figure 4:
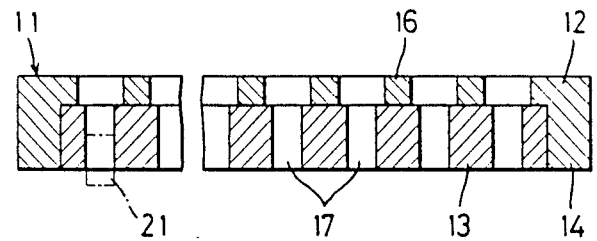
Figure 5:
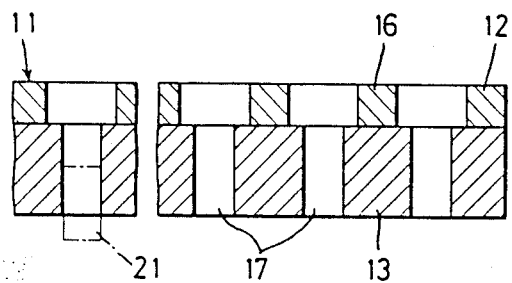

In addition, FIGS. 3, 4 and 5 show modified embodiments of the holding plate 11, namely, the plate 11 comprises, in FIG. 3, the elastic member 14 and frame 14 only, in FIG. 4, the plate body 12 having the frame 14 only at the lower edges of plate 16, and in FIG. 5, the plate body 12 consisting only of the upper plate 16 placed on top of the elastic member 13, the grooves 111 (not shown) like those provided in FIG. 2 being provided around the holding plate in FIGS. 3, 4 or 5.

As seen from the above, the present invention can prevent the holding plate from being stained by dust or the like when the chip parts are inserted onto the insertion apparatus. Also, there is no need that the insertion apparatus and holding plate be set together when the chip parts are inserted therein, whereby complexity in the process is eliminated, and when the chip parts after being inserted into the holding plate have electrode material applied thereto, the process of turning the holding plate upside down can be omitted.

Furthermore, since the holding plate is not stained on the surface by dust or debris of chip parts, there is no fear of soiling the electrode material when applied to the chip parts.

Although several embodiments have been described, they are merely exemplary of the invention and not to be construed as limiting, the invention being defined solely by the appended claims.

I claim:

1. In combination, a holding plate having a plurality of through holes therein surrounded by elastic material for holding chip parts in the through holes, and an insertion apparatus for inserting chip parts into the through holes in the holding plate, said insertion apparatus comprising a generally plate-shaped member with one surface against the under surface of said holding plate and having a plurality of individual through bores therein each separate from the other through bores and at positions corresponding to the positions of the through holes in the holding plate, each of said through bores having a larger portion with an outer end communicating with said one surface of said member and having a cross-sectional size sufficiently large to hold one of the chip parts, and a smaller bore portion extending from the inner end of said larger bore portion to an other surface of said member, said other surface being parallel to and spaced from said one surface, and said smaller bore portion having a cross-sectional size smaller than the cross-sectional size of the chip parts.

2. An insertion apparatus as claimed in claim 1 in which each of said larger bore portions has an inwardly tapered portion at the outer end thereof.

3. An insertion apparatus as claimed in claim 1 in which each of said smaller bore portions has an inwardly tapered portion at the end opening out of said other surface of said member.

* * * * *